United States Patent
Yamane et al.

(10) Patent No.: US 7,633,796 B2
(45) Date of Patent: Dec. 15, 2009

(54) STORAGE ELEMENT AND MEMORY

(75) Inventors: Kazutaka Yamane, Kanagawa (JP); Minoru Ikarashi, Kanagawa (JP); Masanori Hosomi, Kanagawa (JP); Hiroyuki Ohmori, Kanagawa (JP); Tetsuya Yamamoto, Kanagawa (JP); Yutaka Higo, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/013,895

(22) Filed: Jan. 14, 2008

(65) Prior Publication Data

US 2008/0180992 A1 Jul. 31, 2008

(30) Foreign Application Priority Data

Jan. 19, 2007 (JP) ............................. 2007-010549

(51) Int. Cl.
*G11C 11/14* (2006.01)
(52) U.S. Cl. .................. 365/171; 365/173; 365/158; 977/935; 977/934
(58) Field of Classification Search .................. 365/171, 365/173, 158, 131, 66; 257/421, E21.665; 438/3; 977/933, 934, 935
See application file for complete search history.

(56) References Cited

U.S. PATENT DOCUMENTS

| 5,920,500 | A | 7/1999 | Tehrani et al. |
| 6,845,038 | B1 * | 1/2005 | Shukh .................. 365/171 |
| 6,967,863 | B2 | 11/2005 | Huai |
| 2001/0005301 | A1 * | 6/2001 | Komuro et al. .......... 360/324.2 |
| 2002/0163766 | A1 * | 11/2002 | Eguchi et al. .......... 360/324.12 |
| 2009/0027813 | A1 * | 1/2009 | Carey et al. ............ 360/324.12 |

FOREIGN PATENT DOCUMENTS

| JP | 10-116490 | 6/1998 |
| JP | 2000-306374 | 11/2000 |
| JP | 2002-261352 | 9/2002 |
| JP | 2003-017782 | 1/2003 |
| JP | 2005-150303 | 6/2005 |
| JP | 2005-277147 | 10/2005 |

(Continued)

OTHER PUBLICATIONS

Nahas, J. et al., "A 4Mb 0.18μm 1T1MTJ Toggle MRAM Memory," IEEE/ISSCC Visuals Supplement, 2004.

(Continued)

*Primary Examiner*—Richard Elms
*Assistant Examiner*—Harry W Byrne
(74) *Attorney, Agent, or Firm*—K&L Gates LLP (57) ABSTRACT

A storage element includes a storage layer for holding information depending on a magnetization state of a magnetic material; and a magnetization fixed layer in which magnetization direction is fixed, that is arranged relative to the storage layer through a nonmagnetic layer. The magnetization direction of the storage layer is changed with application of an electric current in a laminating direction to enable information to be recorded to the storage layer. A plurality of magnetization regions respectively having magnetization components in laminating directions and having magnetizations in different directions from each other are formed in the magnetization fixed layer or on an opposite side of the magnetization fixed layer relative to the storage layer.

6 Claims, 4 Drawing Sheets

FOREIGN PATENT DOCUMENTS

| | | |
|---|---|---|
| JP | 2006-049436 | 2/2006 |
| JP | 2006-295000 | 10/2006 |
| JP | 2007-103692 | 4/2007 |
| JP | 2007-525033 | 8/2007 |
| JP | 2008-117930 | 5/2008 |
| WO | 2005/083714 | 9/2005 |

OTHER PUBLICATIONS

Japanese Office Action issued on Feb. 24, 2009, for corresponding Japanese Patent Application JP 2007-010549.

* cited by examiner

STORAGE ELEMENT AND MEMORY

CROSS REFERENCES TO RELATED APPLICATIONS

The present application claims priority to Japanese Patent Application No. 2007-010549 filed in the Japanese Patent Office on Jan. 19, 2007, the entire contents of which is being incorporated herein by reference.

BACKGROUND

The present application relates to a storage element constituted by a storage layer for storing a magnetization state of a magnetic material as information and a magnetization fixed layer in which the direction of magnetization is fixed and in which the direction of magnetization of the storage layer is changed with application of an electric current, and to a memory including this storage element. The present application, for example, is suitable for the application to a nonvolatile memory.

As information communication devices, in particular personal compact devices such as mobile phones, are spread greatly, elements such as memories and logic elements configuring information communication devices are required to become higher in performance such as increase of integration degree, increase of speed, and decrease of power consumption.

In particular, nonvolatile memories are considered as components indispensable for making devices higher in function.

Semiconductor flash memories, FeRAM (ferroelectric nonvolatile memory) and so on are commercially available as nonvolatile memories, and active research and development is being conducted in order to make nonvolatile memories higher in performance.

Recently, as a new nonvolatile memory using a magnetic material, development and progress of an MRAM (Magnetic Random Access Memory) using tunnel magnetoresistance effect are remarkable, and the MRAM receives a remarkable attention (see J. Nahas et al. IEEE/ISSCC 2004 Visulas Supplement, page 22, for example).

The MRAM has a structure in which very small storage elements for recording information are regularly arranged and wirings, for example, word lines and bit lines, are provided so as to access each of the storage elements.

Each magnetic memory element is configured so as to have a storage layer capable of recording information as a direction of magnetization of a ferromagnetic material.

Then, a structure using a so-called magnetic tunnel junction (Magnetic Tunnel Junction: MTJ) composed of the above-mentioned storage layer, a tunnel insulating layer (nonmagnetic spacer film), and a magnetization fixed layer in which the direction of magnetization is fixed is adopted as the structure of the magnetic memory element. The direction of magnetization of the magnetization fixed layer can be fixed by providing an antiferromagnetic layer, for example.

In such a structure, a tunnel magnetoresistance effect that a resistance value relative to a tunnel current flowing through the tunnel insulating film changes in response to an angle formed by the direction of magnetization of the storage layer and the direction of magnetization of the magnetization fixed layer takes place, so that information can be written (recorded) using this tunnel magnetoresistance effect. A magnitude of this resistance value becomes a maximum value when the direction of magnetization of the storage layer and the direction of magnetization of the magnetization fixed layer are anti-parallel to each other, and it becomes a minimum value when they are parallel to each other.

In the magnetic memory element having the above-mentioned structure, information can be written (recorded) to the magnetic memory element by controlling the direction of magnetization of the storage layer of the magnetic memory element based on a synthesized current magnetic field generated by applying an electric current to both of the word lines and the bit lines. It is customary that differences of magnetization directions (magnetization states) at that time are stored in the magnetic memory element in response to information "0" and information "1", respectively.

Then, a method using asteroid characteristics (see Japanese Unexamined Patent Application Publication No. Hei-10-116490, for example) and a method using switching characteristics (see Specification of Unexamined US Patent Application Publication No. 2003/0072174, for example) are available as the method of recording (writing) information to the storage element.

On the other hand, when recorded information is read from the magnetic memory element, a memory cell is selected by using a device such as a transistor, and a difference of magnetization of the storage layer is detected as a difference of a voltage signal by using a tunnel magnetoresistance effect of the magnetic memory element, whereby recorded information can be detected.

When this MRAM is compared with other nonvolatile memory, a strongest point of this MRAM is that, since information "0" and information "1" are rewritten by inverting the direction of magnetization of the storage layer formed of a ferromagnetic material, high speed and nearly limitless rewriting (>1015 times) is possible.

However, in the MRAM, a relatively large current magnetic field should be generated in order to rewrite recorded information and an electric current of a relatively large magnitude (for example, several milliamperes to several 10 s of milliamperes) should be applied to the address wiring, so that power consumption is increased.

Also, since the MRAM needs a write address wiring and a read address wiring, it has been structurally difficult to microminiaturize the memory cell.

Further, since the address wiring is thinned as the element is microminiaturized, problems arise that it becomes difficult to apply a sufficient electric current and that the coercive force is increased so that a required current magnetic field is increased and thereby the power consumption is increased.

Consequently, microminiaturization of elements has been difficult.

Hence, a structure capable of recording information independently of a current magnetic field has been studied as a method for solving these problems. In particular, a memory having a structure using magnetization inversion based on spin transfer receives a remarkable attention as a structure in which magnetization can be inverted with a smaller amount of an electric current (see Specification of U.S. Pat. No. 5,695,864, for example).

Magnetization inversion based on spin transfer is such as to cause magnetization to be inverted in another magnetic material by injecting electrons spin-polarized by passing through a magnetic material into the magnetic material (see Japanese Unexamined Patent Application Publication No. 2003-17782, for example).

More specifically, magnetization inversion based on spin transfer is a phenomenon that when spin-polarized electrons passed through a magnetic layer (magnetization fixed layer) in which the direction of magnetization is fixed enter another magnetic layer (magnetization free layer) in which the direction of magnetization is not fixed, torques are applied to the magnetization of this magnetic layer. Then, with application of an electric current larger than a certain threshold value, the direction of the magnetization of the magnetic layer (magnetization free layer) can be inverted.

For example, when an electric current is applied in the direction perpendicular to the film plane of a giant magnetoresistance effect element (GMR element) or a magnetic tunnel junction element (MTJ element), each having a magnetization fixed layer and a magnetization free layer, the direction of magnetization of at least a part of the magnetic layers of these elements can be inverted.

Thus, by constructing the storage element including a magnetization fixed layer and a magnetization free layer (storage layer) and by changing the polarity of an electric current applied to the storage element, the direction of magnetization of the storage layer is inverted, and thereby "0" information and "1" information are rewritten.

With respect to reading recorded information, by constructing the storage element such that a tunnel insulating layer is provided between the magnetization fixed layer and the magnetization free layer (storage layer), recorded information can be read out from the storage element by using the tunnel magnetoresistance effect as in the MRAM.

Further, the magnetization inversion based on spin transfer has an advantage that magnetization inversion can be realized without increasing an electric current even when the element is microminiaturized.

The absolute value of an electric current that is applied to the storage element in order to invert magnetization is 1 mA or less in a storage element of which scale is about 0.1 μm, for example. In addition, the absolute value of the electric current decreases in proportion to the volume of the storage element, which is advantageous from a scaling standpoint.

Moreover, since recording word lines, which are required in the MRAM, become unnecessary, there is an advantage that the structure of a memory cell is simplified.

Hereinafter, a storage element using spin transfer will be referred to as a "SpRAM (Spin transfer Random Access Memory)" and spin polarization electron flow to cause spin transfer will be referred to as a "spin injection current".

So far the SpRAM has been greatly expected as a nonvolatile memory that can decrease power consumption and increase a capacity while maintaining the advantage of the MRAM that it can be operated at a high speed and the number of time of rewriting is nearly limitless.

Figure 1:
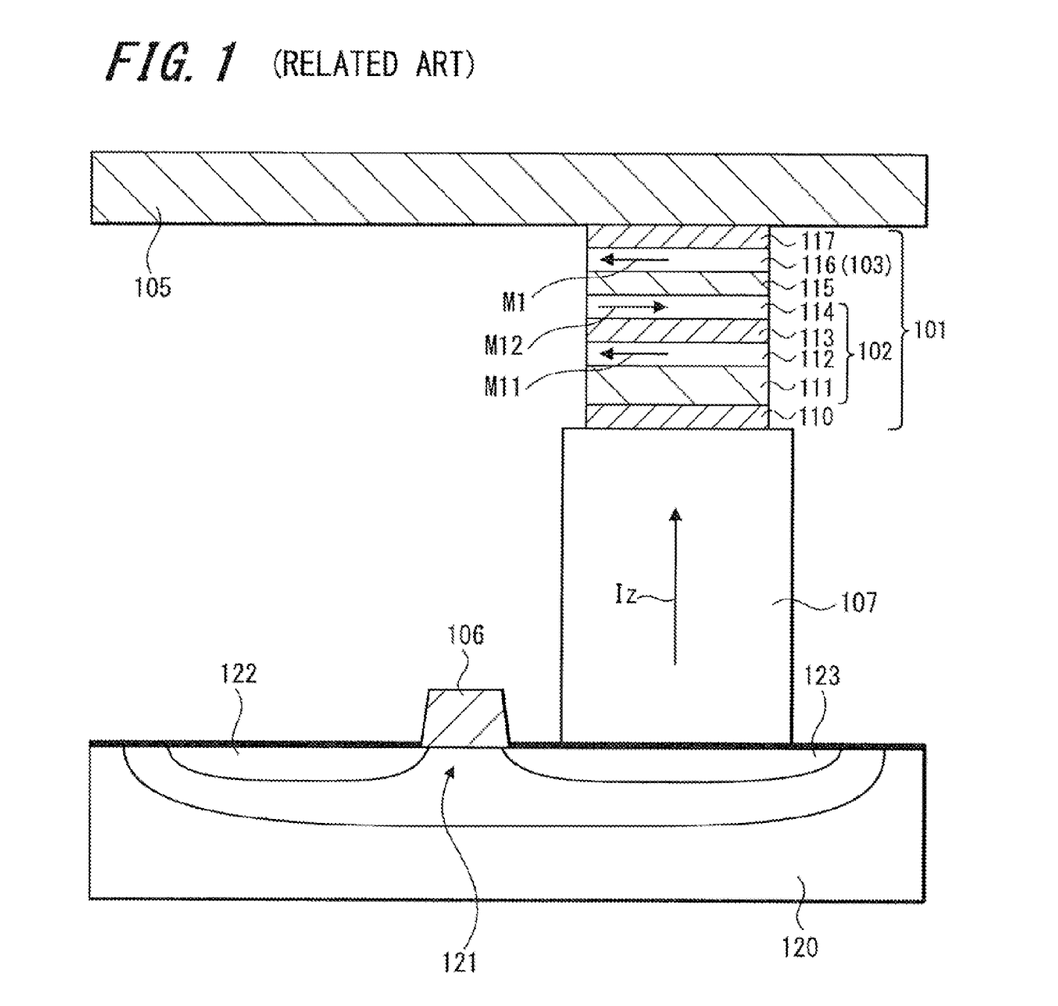
FIG. 1 is a schematic cross-sectional view of a memory cell of a memory using spin transfer according to the related art.

FIG. 1 of the accompanying drawings is a schematic cross-sectional view showing a memory cell of a memory (SpRAM) using spin transfer according to the related art.

While a suitable device such as a diode or MOS (metal-oxide semiconductor) transistor can be used to electrically select a memory cell in order to read information from the memory cell, the memory cell shown in FIG. 1 uses a MOS transistor.

First, a structure of a storage element 101 that constitutes a memory cell of a SpRAM will be described.

As shown in FIG. 1, ferromagnetic layers 112 and 114 are arranged through a nonmagnetic layer 113 and thereby they are coupled in an antiferromagnetic coupling fashion. Further, the ferromagnetic layer 112 on the lower layer side is arranged in contact with an antiferromagnetic layer 111, and it is given strong unidirectional magnetic anisotropy by exchange interaction acting between the ferromagnetic layer 112 and the antiferromagnetic layer 111. Then, these four layers 111, 112, 113 and 114 constitute a magnetization fixed layer 102. That is, the magnetization fixed layer 102 includes the two ferromagnetic layers 112 and 114.

A ferromagnetic layer 116 is configured in a manner such that the direction of a magnetization M1 thereof can rotate relatively easily, and this ferromagnetic layer 116 constitutes a storage layer (magnetization free layer) 103.

A tunnel insulating layer 115 is formed between the ferromagnetic layers 114 and 116 of the magnetization fixed layer 102, that is, between the magnetization fixed layer 102 and the storage layer (magnetization free layer) 103. This tunnel insulating layer 105 plays a role of disconnecting magnetic coupling between the upper and lower magnetic layers 116 and 114 and a role of causing a tunnel current to flow. As a result, a TMR (tunnel magnetoresistance effect) element is constituted by the magnetization fixed layer 102 in which the magnetization direction of the magnetic layer is fixed, the tunnel insulating layer 115, and the storage layer (magnetization free layer) 103 in which the magnetization direction can be changed.

Then, the above-mentioned respective layers 111 to 116, an underlayer film 110, and a topcoat layer 117 constitute the storage element 101 including the TMR element.

Also, a selection MOS transistor 121 is formed in a silicon substrate 120, and a connection plug 107 is formed on one diffusion layer 123 of this selection MOS transistor 121. The underlayer film 110 of the storage element 101 is connected onto the connection plug 107. The other diffusion layer 122 of the selection MOS transistor 121 is connected through a connection plug to a sense line, although not shown. A gate 106 of the selection MOS transistor 121 is connected to a selection signal line.

The topcoat layer 117 of the storage element 101 is connected to a bit line (BL) 105 formed on the topcoat layer 117.

In a stationary state, magnetization M11 of the ferromagnetic layer 112 and magnetization M12 of the ferromagnetic layer 114 are in nearly completely anti-parallel states by strong ferromagnetic coupling through the nonmagnetic layer 113.

Since it is customary that the ferromagnetic layers 112 and 114 are configured so as to have equal products of saturated magnetization film thicknesses, a leakage component of a magnetic pole magnetic field is negligibly small.

Then, depending on a state that the direction of the magnetization M1 of the ferromagnetic layer 116 of the storage layer 103 and the direction of the magnetization M12 of the ferromagnetic layer 114 of the magnetization fixed layer 102 are in a parallel or anti-parallel state across the tunnel insulating layer 115, the resistance value of the TMR element composed of these layers 114, 115 and 116 is changed. When the two magnetizations M1 and M2 are in the parallel state, the resistance value is decreased. When they are in the anti-parallel state, the resistance value is increased. As the resistance value of the TMR element (114, 115, 116) is changed, the resistance value of the whole of the storage element 101 is changed. By using this phenomenon, information can be recorded to the memory cell or information can be read out from the memory cell. More specifically, by assigning a state that a resistance value is low to information "0" and a state that a resistance value is high to information "1", binary (1 bit) information can be recorded to the memory cell.

It should be noted that, since the ferromagnetic layer 114 on the side of the storage layer 103 of the magnetization fixed layer 102 becomes a standard of the direction of the magnetization M1 of the storage layer 103 and is referred to when reading out recorded information, this ferromagnetic layer 114 is referred to as a "reference layer".

A spin injection current Iz should be applied to the storage element 101 in order to rewrite information stored in the memory cell or to read information from the memory cell.

This spin injection current Iz passes through the storage element 101, the diffusion layer 123, and the bit line 105.

The direction of the spin injection current Iz flowing through the storage element 101 can be changed from upward to downward and vice versa by changing the polarity of this spin injection current Iz.

In consequence, information stored in the memory cell can be rewritten by changing the direction of the magnetization M1 of the storage layer 103 of the storage element 101.

Meanwhile, there is proposed a structure of an SpRAM in which not only the spin injection current Iz is applied to the storage element but also a bias current magnetic field is applied to the storage element in order to invert the direction of magnetization of the storage layer of the storage element (see Japanese Unexamined Patent Application Publication No. 2005-277147).

To be more concrete, in the structure shown in FIG. 1, for example, the spin injection current Iz is applied through the bit line 105 to the storage element 101 and a bias current magnetic field Hz (not shown) generated by an electric current (equal to the spin injection current Iz) flowing through the bit line 105 is applied to the storage layer 103 of the storage element 101.

Thereby, it becomes possible to efficiently change the direction of the magnetization M1 of the storage layer 103.

Hereinafter, a state diagram in which a vertical axis represents the spin injection current Iz and a horizontal axis represents the bias current magnetic field Hx and a state of a memory cell is expressed will be referred to as a "phase diagram". It should be noted that when the spin injection current Iz and a bias current to generate the bias current magnetic field Hx are formed of pulse currents, a phase diagram is made using a peak value of a pulse current.

SUMMARY

In the storage element 101 having the structure shown in FIG. 1, the magnitude of spin torque which acts on a magnetization Mfree (=M1) of the storage layer (magnetization free layer) 103 is proportional to a vector triple product $M_{free} \times M_{free} \times M_{ref}$, wherein $M_{ref}$ is a magnetization (=M12) of the reference layer (ferromagnetic layer) 114.

In the initial state, since the magnetization $M_{free}$ of the storage layer (magnetization free layer) 103 and the magnetization $M_{ref}$ of the reference layer (ferromagnetic layer) 114 are set in the anti-parallel state, the spin torque which first acts on magnetization is very small.

Because the spin torque is small as described above, a magnetization inverting current is increased.

A general phase diagram contains a hysteresis region, a region (0 state region) in which a memory cell is set to a low resistance state, that is, 0 state regardless of an initial magnetization state, a region (1 state region) in which a memory cell is set to a high resistance state, that is, 1 state regardless of an initial magnetization state and an unstable operation region in which the aforementioned three regions exist in a mixed state.

In order to enable the SpRAM to function as a memory having a real margin (operation margin), three regions (hysteresis region, 0 state region and 1 state region) should exist sufficiently widely and independently.

The hysteresis region can be also referred to as a "bistable operation region". Also, the 0 state region and the 1 state region can be also referred to as "monostable operation regions".

Figure 2:
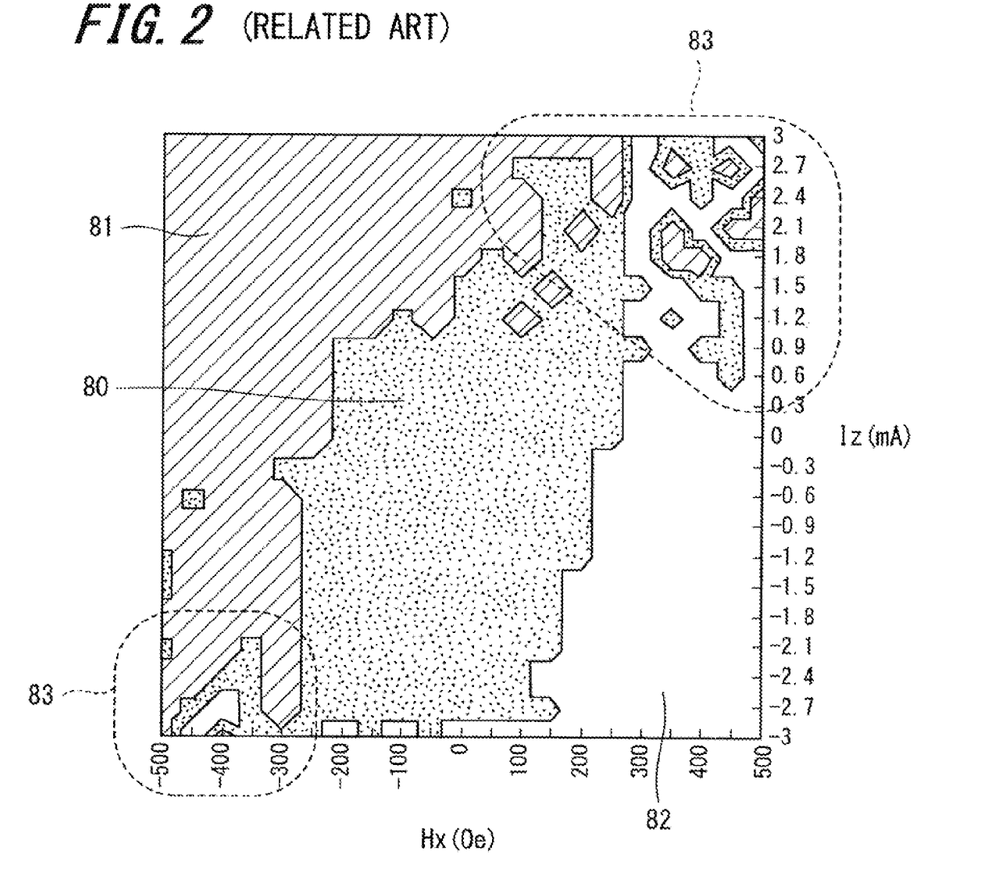
FIG. 2 is a phase diagram of the storage element shown in FIG. 1.

Here, FIG. 2 shows an example of a measured phase diagram in the storage element 101 shown in FIG. 1. FIG. 2 shows a case that the pulse width of an electric current of the spin injection current Iz is selected to be 1 ns (nanosecond).

The phase diagram shown in FIG. 2 is a state diagram showing a memory cell state in which a vertical axis represents a pulse peak value of the spin injection current Iz and a horizontal axis represents a pulse peak value of the bias current magnetic field Hx.

In the phase diagram, the bistable operation region (hysteresis region 80) and the monostable operation regions (0 state region 81 and 1 state region 82) are separated from each other and hence the SpRAM is enabled to operate stably.

As shown in FIG. 2, unstable operation regions 83 in which the three states 80, 81, 82 exist in a mixed state exist in upper right end portion (first quadrant) and in a lower left end portion (third quadrant) in FIG. 2.

When the unstable operation regions 83 exist as described above, the spin injection current Iz and the bias current magnetic field Hz when the magnetization inversion operation is carried out are set so as not to cover the unstable operation regions 83.

However, in the phase diagram shown in FIG. 2, since the bistable operation region 80 widely exists, unless the spin injection current Iz and the bias current magnetic field Hx are increased, the monostable operation regions 81 and 82 are not covered. Therefore, as mentioned hereinbefore, it is to be understood that the magnetization inverting current should be increased.

It is desirable to provide a storage element capable of recording information with a small amount of an electric current and a memory including the storage element.

A storage element according to an embodiment includes a storage layer for holding information depending on a magnetization state of a magnetic material and a magnetization fixed layer in which a magnetization direction is fixed, that is arranged relative to the storage layer through a nonmagnetic layer. The magnetization direction of the storage layer is changed with application of an electric current in a laminating direction to enable information to be recorded to the storage layer, and a plurality of magnetization regions respectively having magnetization components in laminating directions and having magnetizations in different directions from each other are formed in the magnetization fixed layer or on an opposite side of the magnetization fixed layer relative to the storage layer.

A memory according to an embodiment includes a storage element including a storage layer for holding information depending on a magnetization state of a magnetic material, the magnetization direction of the storage layer being changed with application of an electric current in a laminating direction to enable information to be recorded to the storage layer, and a wiring for supplying an electric current that is caused to flow in the laminating direction of this storage element. The storage element has the structure of the above-described storage element according to an embodiment.

According to the embodiment, the storage element includes the storage layer for holding information depending on the magnetization state of the magnetic material, and the magnetization fixed layer is provided relative to this storage layer through the nonmagnetic layer. The electric current is applied in the laminating direction to change the direction of the magnetization of the storage layer so as to record information to the storage layer by causing the electric current to flow in the laminating direction to change the direction of the magnetization of the storage layer by spin injection and so information can be recorded to the storage element.

Then, since a plurality of magnetization regions respectively having magnetization components in laminating direction and having magnetizations in different directions from each other are formed in the magnetization fixed layer or on an opposite side of the magnetization fixed layer relative to the storage layer, two spin torques with different directions act on the magnetization of the storage layer from these magnetization regions. As a result, the direction of the magnetization of the storage layer can be inverted with a small amount of an electric current. Also, it becomes possible to stably carry out switching to change the direction of the magnetization regardless of the pulse width of the spin injection current.

According to an embodiment, the memory includes the storage element including the storage layer for holding information depending on the magnetization state of the magnetic material, the magnetization direction of the storage layer being changed with application of the electric current in the laminating direction to enable information to be recorded to the storage layer, and the wiring for supplying the electric current that is caused to flow in the laminating direction of this storage element. The storage element has the structure of the storage element according to an embodiment, and therefore by causing the electric current to flow in the laminating direction of the storage element through the wiring, information can be recorded to the memory by spin injection.

Also, information can be recorded with a small amount of an electric current, and it becomes possible to stably record information regardless of the pulse width of the spin injection current.

According to an embodiment, the magnetization direction of the storage layer can be inverted with the small amount of electric current to record information.

Thus, by reducing the electric power necessary for recording information, it is enabled to realize a memory consuming less power.

Also, since it becomes possible to stably carry out switching regardless of the pulse width of the spin injection current, the margin relative to the pulse width of the spin injection current can be widened.

Consequently, it is possible to realize a highly-reliable storage element in which information can be recorded stably.

Also, since the margin relative to the pulse width is widened, the memory can be operated stably even when characteristics of memory cells are slightly fluctuated. Thus, it becomes possible to stably operate even a large capacity memory including a large number of memory cells.

That is, according to an embodiment of the present application, it is possible to realize a memory with a large storage capacity that can be operated stably.

Additional features and advantages are described herein, and will be apparent from, the following Detailed Description and the figures.

DETAILED DESCRIPTION

A memory (SpRAM) using spin transfer has sufficiently large anisotropy so that magnetization of a storage layer (magnetization free layer) can become stable against heat fluctuation.

A degree of stability of magnetization of a storage layer against the above-mentioned heat fluctuation, that is, an index of thermal stability, can be generally expressed by a thermal stability parameter ($\Delta$).

The thermal stability $\Delta$ is given by $\Delta$=KuV/kBT (Ku: anisotropic energy, V: volume of storage layer, kB: Boltzmann constant, T: absolute temperature).

In the related-art SpRAM, since the ferromagnetic layer configuring the magnetization fixed layer is formed thin, a saturation magnetic field Hs is increased. This saturation magnetic field Hs can be expressed as 2 J/(Ms·d) in which J represents a magnitude of antiferromagnetic coupling of an antiferromagnetically-coupled magnetization fixed layer (a plurality of ferromagnetic layers are antiferromagnetically-coupled) and Ms represents a saturation magnetization of each ferromagnetic layer of the magnetization fixed layer.

When the saturation magnetic field Hs is large, it is necessary to increase an electric current for inverting the direction of the magnetization of the storage layer, that is, a magnetization inverting current.

Further, in the memory (SpRAM) using spin transfer, it is required not only that the index of thermal stability (thermal stability parameter) $\Delta$ is kept to be higher than a certain degree but also that the magnetization inverting current is decreased at the same time.

Then, after various examinations, it has been discovered that by forming a plurality of magnetization regions respectively having magnetization components in laminating directions and having magnetizations in different directions from each other in the magnetization fixed layer or in the layer existing on the opposite side of the magnetization fixed layer relative to the storage layer, the magnetization inverting current can be decreased and at the same time sufficient thermal stability can be obtained and thereby a stable memory can be formed.

Then, the inventors of the present application have discovered that as a method of forming a plurality of magnetization regions respectively having magnetization components in laminating directions and having magnetizations in different directions from each other in the ferromagnetic layer of the magnetization fixed layer, a method of inserting a magnetic material having a magnetization component in a laminating direction and being in a state of particles or a layer into the ferromagnetic layer of the magnetization fixed layer is effective.

By forming the magnetization regions respectively having the magnetization components in the laminating directions and having the magnetizations in different directions from each other in the ferromagnetic layer of the magnetization fixed layer, two spin torques with different directions act on the storage layer from these magnetization regions.

Since it becomes possible to easily invert the direction of the magnetization of the storage layer with these two spin torques, the direction of the magnetization of the storage layer can be inverted with a small amount of an electric current. Also, it becomes possible to carry out stable switching to change the direction of the magnetization regardless of the pulse width of the spin injection current.

Subsequently, specific embodiments of the present application will be described.

Figure 3:
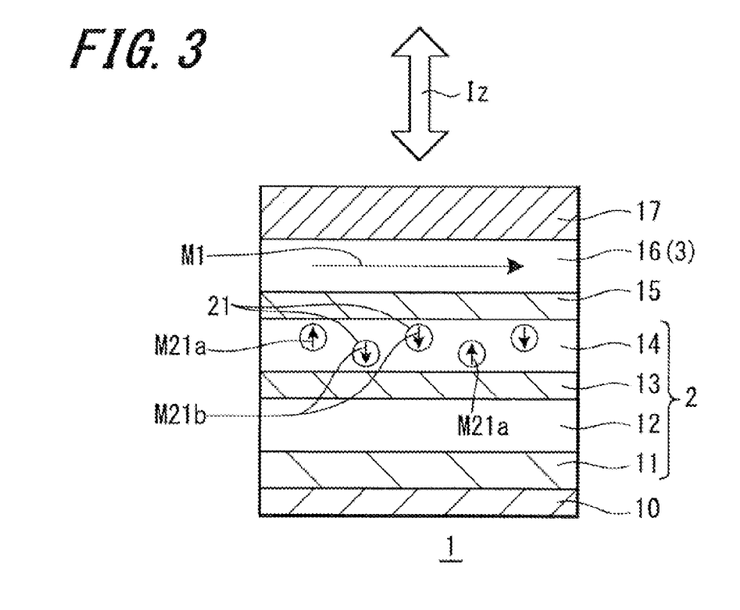
FIG. 3 is a schematic structural diagram (cross-sectional diagram) of a storage element according to an embodiment.

FIG. 3 is a schematic structural diagram (cross-sectional view) showing a storage element according to an embodiment.

As shown in FIG. 3, this storage element 1 is constituted by a TMR element (tunnel magnetoresistance effect) element.

Since ferromagnetic layers 12 and 14 are arranged through a nonmagnetic layer 13, they are antiferromagnetically-coupled with each other. Further, the ferromagnetic layer 12 is arranged in contact with an antiferromagnetic layer 11, and it is given a strong unidirectional magnetic anisotropy by exchange interaction acting between these layers 12 and 11. These four layers 11, 12, 13 and 14 constitute a magnetization fixed layer 2. That is, the magnetization fixed layer 2 includes the ferromagnetic layers 12 and 14 in two layers.

A ferromagnetic layer 16 is configured in a manner such that the direction of a magnetization M1 thereof may rotate relatively easily. A storage layer (magnetization free layer) 3 is constituted of this ferromagnetic layer 16.

A tunnel insulating layer 15 is formed between the ferromagnetic layers 14 and 16, that is, between the magnetization fixed layer 2 and the storage layer (magnetization free layer) 3. This tunnel insulating layer 15 plays a role of disconnecting magnetic coupling between the upper and lower magnetic layers 16 and 14 and a role of applying a tunnel current. As a consequence, a TMR (tunnel magnetoresistance effect) element is constituted by the magnetization fixed layer 2 in which the direction of the magnetization of the magnetic layer is fixed, the tunnel insulating layer 15, and the storage layer (magnetization free layer) 3 in which the direction of the magnetization can be changed.

Then, the above-mentioned respective layers 11 to 16, an underlayer film 10, and a topcoat layer 17 constitute the storage element 1 formed of the TMR element.

Directions of the magnetization of the ferromagnetic layer 12 and the magnetization of the ferromagnetic layer 14 are set to anti-parallel by strong ferromagnetic coupling through the nonmagnetic layer 13.

Then, depending on a state that the direction of a magnetization M1 of the ferromagnetic layer 16 of the storage layer 3 and the direction of a magnetization of the ferromagnetic layer 14 of the magnetization fixed layer 2 are in a parallel or anti-parallel state across the tunnel insulating layer 15, the resistance value of the TMR element composed of these layers 14, 15 and 16 is changed. When the two magnetizations are in the parallel state, the resistance value is decreased. When they are in the anti-parallel state, the resistance value is increased. As the resistance value of the TMR element (14, 15, 16) is changed, the resistance value of the whole of the storage element 1 is changed. By using this phenomenon, information can be recorded and recorded information can be read out. More specifically, by assigning a state that a resistance value is low to information "0" and a state that a resistance value is high to information "1", binary (1 bit) information can be recorded.

It should be noted that since the ferromagnetic layer 14 of the magnetization fixed layer 2 located closest to the storage layer 3 becomes a standard of the direction of the magnetization M1 of the storage layer 3 and is referred to when information is read out from the memory, this ferromagnetic layer 14 is referred to as a "reference layer".

A spin injection current Iz should be applied in the laminating direction of the storage element 1 in order to rewrite information stored in the memory cell or to read out recorded information from the memory cell.

The direction of the spin injection current Iz flowing through the storage element 1 can be changed from upward to downward and vice versa by changing the polarity of this spin injection current Iz.

In consequence, information stored in the memory cell can be rewritten by changing the direction of the magnetization M1 of the storage layer 3 of the storage element 1.

It should be noted that the storage element 1 according to an embodiment also can be configured to be connected to a selection MOS transistor formed on a silicon substrate to read the memory cell as in the related-art storage element 101 shown in FIG. 1.

Also, the storage element 1 can be connected to a wiring such that the spin injection current Iz is applied in the laminating direction of the storage element 1 through this wiring.

In the storage element 1 according to an embodiment, in particular, ferromagnetic materials 21 having vertical magnetic anisotropy are distributed in the ferromagnetic layer 14 of the magnetization fixed layer 2 in a state of particles.

As a result, in addition to a magnetization (not shown) in the film plane direction of the ferromagnetic layer 14, magnetizations M21a and M21b having magnetization components in the laminating direction (vertical direction of FIG. 3) are generated in the ferromagnetic layer 14. In FIG. 3, the magnetizations M21a are directed upward and the magnetizations M21b are directed downward and these are directed in substantially opposite directions.

The above upward and downward magnetizations M21a and M21b can be obtained by applying a magnetic field in the laminating direction and by decreasing the magnitude of the applied magnetic field to be finally demagnetized.

While the upward magnetization M21a and the downward magnetization M21b are generated randomly, a total sum of magnetizations of the whole of the particle-state ferromagnetic materials 21 distributed in the ferromagnetic layer 14 is canceled (becomes zero).

At that time, a magnetic field is also applied to the ferromagnetic layers 12, 14 and 16 in the laminating direction. However, since the magnetizations of these ferromagnetic layers 12, 14 and 16 are strongly fixed in the film plane direction by shape anisotropy in the film plane direction and a diamagnetic field acting in the laminating direction, these magnetization directions are directed in the film plane direction when the application of the magnetic field in the laminating direction is stopped.

Since the magnetizations M21a and M21b having the magnetization components in the laminating direction are generated, the aforementioned vector triple product Mfree×Mfree× Mref of the magnetization M1 of the storage layer 3 and these magnetizations M21a and M21b can be increased in the initial state.

Accordingly, very large spin torque is applied to an extremely narrow region of the magnetization M1 of the storage layer 3 just above the magnetizations M21a and M21b of the ferromagnetic material 21.

Since the whole layer of the storage layer 3 has the magnetization M1 in the same direction, the magnetic domain has no boundary and the magnetization M1 can be expressed by one large arrow as in FIG. 3.

Here, if the storage layer 3 is viewed as being divided into small area, it is to be noted that each of the divided areas has the magnetization M1. Then, it can be interpreted as that a large number of areas respectively having the magnetizations M1 in the same direction are gathered to construct the storage layer 3.

Owing to the ferromagnetic materials 21 within the ferromagnetic layer 14 of the magnetization fixed layer 2☐the magnetizations M21a and M21b having the magnetization components in the laminating direction and in opposite directions to each other act on the individual areas configuring the storage layer 3.

Figure 4:
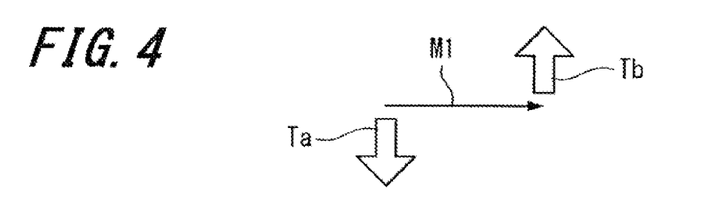
FIG. 4 is a diagram showing spin torque applied to the magnetization of storage layers shown in FIGS. 3, 5, 6 and 7.

As a result, in the small areas constituting the storage layer 3, spin torques Ta and Tb in opposite directions to each other act on the magnetization M1 as shown in FIG. 4.

Owing to actions of these spin torques Ta and Tb, the direction of the magnetization M1 can be easily inverted in each of the small areas constituting the storage layer 3.

Consequently, the direction of the magnetization M1 can be easily inverted in the whole of the storage layer 3.

In an embodiment, while the magnetizations M21a and M21b having the magnetization components in the laminating direction are generated in the ferromagnetic layer 14 of the magnetization fixed layer 2, the direction of the magnetization M1 of the storage layer 3 can be controlled by the direction (polarity) of the spin injection current Iz as in the storage element 101 shown in FIG. 1.

In an embodiment, materials similar to those of the related-art storage element can be used as the materials of respective layers configuring the storage element 1.

PtMn, for example, can be used as the materials of the ferromagnetic layer 11.

Ferromagnetic materials such as CoFe can be used as the materials of the ferromagnetic layers 12 and 14 of the magnetization fixed layer 2.

Ru, Ta, Cr, Cu and so on, for example, can be used as the material of the nonmagnetic layer 13.

MgO, for example, can be used as the material of the tunnel insulating layer 15.

Ferromagnetic materials such as CoFeB can be used as the material of the ferromagnetic layer 16 of the storage layer 3.

Ferromagnetic materials such as FePt, CoPt, FeTbCo, CoPd and Co—Cr-based materials can be used as the material of the ferromagnetic material 21 that is distributed into the ferromagnetic layer 14.

Then, for example, the ferromagnetic layer 14, the ferromagnetic material layers formed of 1 to 2 atomic layers, and the ferromagnetic layer 14 are deposited in that order, and this laminated film is treated by heat treatment, whereby the structure that the ferromagnetic material 21 is distributed into the ferromagnetic layer 14 in a state of particles can be manufactured.

According to an embodiment of the storage element 1, since the particle-state ferromagnetic material 21 is distributed into the ferromagnetic layer 14 of the magnetization fixed layer 2, the magnetization regions respectively having the magnetization components in the laminating direction and having the magnetizations M21a and M21b in different directions from each other are formed in the ferromagnetic layer 14. These magnetization regions enable the large spin torques Ta and Tb in the opposite directions relative to each other to act on the magnetization M1 of the storage layer 3.

As a consequence, since the direction of the magnetization M1 of the storage layer 3 can be inverted with ease, the direction of the magnetization M1 of the storage layer 3 can be inverted with the spin injection current Iz of a relatively small amount of an electric current.

Accordingly, the spin injection current Iz necessary for recording information can be decreased and thereby the power consumption can be decreased.

For example, in the storage element 1 having the structure in which the thermal stability index $\Delta$ is equal to 60 ($\Delta$=60), even when the pulse width of the spin injection current Iz is selected to be relatively as short as ins (nanosecond), magnetization can be inverted with a small amount of an electric current 0.3 mA or smaller.

On the other hand, in the storage element 1 having the related-art structure shown in FIG. 1, if the thermal stability index $\Delta$ is selected to be equal to 60 ($\Delta$=60), an amount of an electric current 2 mA or greater becomes necessary in order to invert magnetization at the pulse width of 1 ns.

Also, according to the storage element 1 of an embodiment, since the large spin torques Ta and Tb in opposite directions to each other can be caused to act on the magnetization M1 of the storage layer 3, it becomes possible to carry out stable switching regardless of the pulse width of the spin injection current Iz.

Thus, information can be recorded stably, and it is possible to realize the storage element 1 that is highly reliable.

Also, since the margin of the spin injection current Iz relative to the pulse width is expanded, the storage element 1 can be operated stably even though characteristics of each memory cell are slightly fluctuated, and it becomes possible to stably operate even a large capacity memory including a large number of memory cells.

Accordingly, a large storage capacity memory that consumes less power and that is operated stably can be realized by configuring it to include a large number of memory cells formed of the storage elements 1 shown in FIG. 3.

Figure 5:
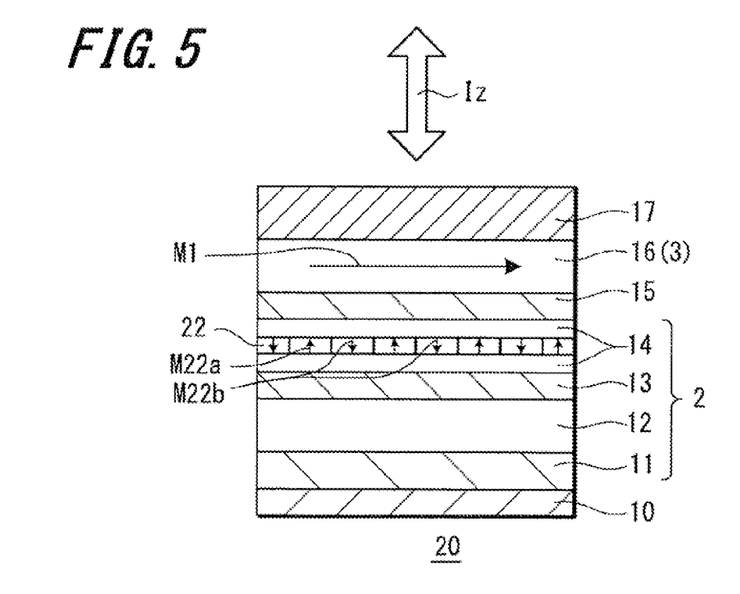
FIG. 5 is a structural diagram (cross-sectional view) showing a storage element according to another embodiment.

Now, FIG. 5 is a schematic structural diagram (cross-sectional view) of a storage element according to another embodiment.

As shown in FIG. 5, a storage element 20 according to an embodiment has a structure that a vertical magnetization layer 22 is inserted into the ferromagnetic layer 14 of the magnetization fixed layer 2 as a ferromagnetic layer having a magnetization component in a laminating direction (vertical direction of FIG. 5).

This vertical magnetization layer 22 is divided by magnetic domains, and a magnetization region having an upward magnetization M22a and a magnetization region having a downward magnetization M22b are alternately formed in the magnetic domains.

The magnetization regions of the vertical magnetization layer 22, respectively having the upward and downward magnetizations M22a and M22b, can be obtained by applying a magnetic field in the laminating direction and by decreasing the magnitude of the applied magnetic field progressively to be finally demagnetized.

The rest of the structure is similar to that of the storage element 1 of the previously discussed embodiment. Therefore, in FIG. 5, elements and parts identical to those of FIG. 3 are denoted by identical reference numerals and duplicative description thereof will be omitted.

Since the magnetization regions with the magnetizations M22a and M22b having the magnetization components in the laminating direction are formed in the vertical magnetization layer 22, the vector triple product Mfree×Mfree×Mref of the magnetization M1 of the aforementioned storage layer 3 and the magnetizations M22a and M22b can be increased in the initial state.

Accordingly, very large torque is applied to an extremely narrow region of the magnetization M1 of the storage layer 3 just above the magnetizations M22a and M22b of the vertical magnetization layer 22.

Due to the vertical magnetization layer 22 within the ferromagnetic layer 14 of the magnetization fixed layer 2, the magnetizations M22a and M22b in opposite directions to each other and having the magnetization components in the laminating direction act on individual regions constituting the storage layer 3.

As a result, as in the storage element 1 of the preceding embodiment, the spin torques which are shown in FIG. 4 are applied to the magnetization M1 in the small regions constituting the storage layer 3.

As shown in FIG. 4, the spin torques Ta and Tb in opposite directions to each other act on the magnetization M1.

Owing to the action of the spin torques Ta and Tb, the direction of the magnetization M1 can be easily inverted in each of the small regions constituting the storage layer 3.

As a result, the direction of the magnetization M1 can be easily inverted in the whole of the storage layer 3.

Also in this embodiment, while the magnetizations M22a and M22b having the magnetization components in the laminating direction are generated within the ferromagnetic layer 14 of the magnetization fixed layer 2, the direction of the magnetization M1 of the storage layer 3 can be controlled based on the direction (polarity) of the spin injection current Iz as in the storage element 101 shown in FIG. 1.

Ferromagnetic materials such as FePt, CoPt, FeTbCo, CoPd and Co—Cr-based material can be used as the material of the vertical magnetization layer 22.

According to the above-mentioned structure of the storage element 20 of an embodiment, the vertical magnetization layer 22 is inserted into the ferromagnetic layer 14 of the magnetization fixed layer 2 as the ferromagnetic layer having the magnetization component in the laminating direction, and the magnetization region with the upward magnetization M22a and the magnetization region with the downward magnetization M22b, that is, a plurality of magnetization regions in which magnetic directions are opposite to each other are formed in this vertical magnetization layer 22.

Owing to these magnetization regions, as in the storage element 1 of the preceding embodiment, the large spin torques Ta and Tb in opposite directions to each other can be caused to act on the magnetization M1 of the storage layer 3.

As a consequence, since the direction of the magnetization M1 of the storage layer 3 can be easily inverted, the direction of the magnetization M1 of the storage layer 3 can be inverted with the spin injection current Iz of a relatively small amount of an electric current.

Accordingly, the spin injection current Iz required in recording information can be decreased and thereby power consumption can be decreased.

Also, according to the storage element 20 of an embodiment, since the large spin torques Ta and Tb in opposite directions to each other can be caused to act on the magnetization M1 of the storage layer 3, it becomes possible to carry out stable switching regardless of the pulse width of the spin injection current Iz.

As a result, information can be recorded stably, and it is possible to realize the storage element 20 that is highly reliable.

Also, since the margin of the spin injection current Iz relative to the pulse width is widened, the storage element 20 can be stably operated even though characteristics of each memory cell are slightly fluctuated, and even a large capacity memory having a large number of memory cells is enabled to operate stably.

Accordingly, by adopting the structure having a large number of memory cells formed of the storage element 20 shown in FIG. 5, it is possible to realize a large capacity memory that consumes less power and that can be operated stably.

Figure 6:
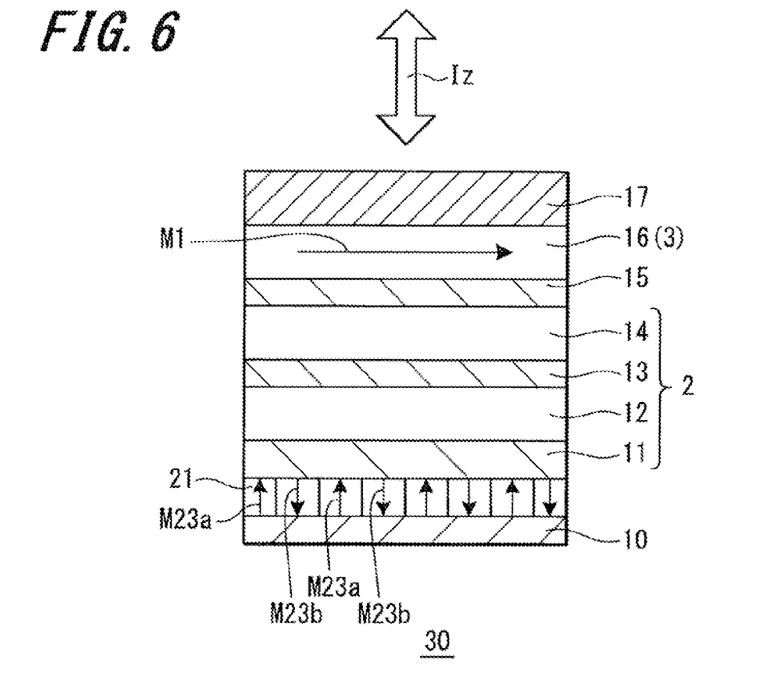
FIG. 6 is a structural diagram (cross-sectional view) showing a storage element according to still another embodiment.

FIG. 6 is a schematic structural diagram (cross-sectional view) showing a storage element according to still another embodiment.

As shown in FIG. 6, a storage element 30 according to an embodiment has a structure that in particular a vertical magnetization layer 23 is formed in the under layer of the antiferromagnetic layer 11 of the magnetization fixed layer 2 as a ferromagnetic layer having a magnetization component in a laminating direction.

This ferromagnetic layer 23 is provided between the underlayer 10 and the antiferromagnetic layer 11 and is divided by magnetic domains, and a magnetization region having an upward magnetization M23a and a magnetization region having a downward magnetization M23b are alternately formed in respective magnetic domains.

The magnetization regions having the upward and downward magnetizations M23a and M23b in the vertical magnetization layer 23 can be obtained by applying a magnetic field in the laminating direction and by decreasing the magnitude of the applied magnetic field progressively to be finally demagnetized.

On the other hand, the magnetization region having the magnetization component in the laminating direction is not formed on the ferromagnetic layer 14 of the magnetization fixed layer 2.

The rest of the structure is similar to those of the storage elements 1 and 20 of the preceding embodiments. In FIG. 6, elements and parts identical to those of FIGS. 3 and 5 are denoted by identical reference numerals and duplicative description thereof will be omitted.

In an embodiment, the vertical magnetization layer 23 exists in the lower layer of the antiferromagnetic layer 11 of the magnetization fixed layer 2, and several layers 11 to 14 exist between the storage layer 3 and the vertical magnetization layer 23. Effects similar to those achieved by the storage elements 1 and 20 of the preceding embodiments shown in FIGS. 3 and 5 can be achieved insofar as the sum total of thicknesses of the respective layers 11 to 14 between the storage layer 3 and the vertical magnetization layer 23 falls within a distance in which spin polarization of electrons can be preserved.

Then, since the magnetization regions having the magnetizations M23a and M23b with the magnetization components in the laminating direction are formed in the vertical magnetization layer 23, the vector triple product Mfree× Mfree×Mref of the magnetization M1 of the aforementioned storage layer 3 and the magnetizations M23a and M23b can be increased in the initial state.

Accordingly, very large torque is applied to the extremely narrow region of the magnetization M1 of the storage layer 3 just above the magnetizations M23a and M23b of the vertical magnetization layer 23.

Owing to the vertical magnetization layer 23 lying under the magnetization fixed layer 2, the magnetizations M23a and M23b in opposite directions to each other and having the magnetization components in the laminating direction act on individual regions constituting the storage layer 3.

As a result, as in the storage element 1 of the preceding embodiment, spin torques, which are shown in FIG. 4, are applied to the magnetization M1 in each small regions constituting the storage layer 3.

As shown in FIG. 4, the spin torques Ta and Tb in opposite directions to each other act on the magnetization M1.

Owing to the action of these spin torques Ta and Tb, the direction of the magnetization M1 can be easily inverted in each of the small regions that constitutes the storage layer 3.

As a consequence, the direction of the magnetization M1 can be easily inverted in the whole of the storage layer 3.

Also in an embodiment, the direction of the magnetization M1 of the storage layer 3 can be controlled based on the direction (polarity) of the spin injection current Iz as in the storage element 101 shown in FIG. 1.

Ferromagnetic materials such as FePt, CoPt, FeTbCo, CoPd and Co—Cr-based material can be used as the material of the vertical magnetization layer 23.

According to the above-mentioned structure of the storage element 30 of an embodiment, the vertical magnetization layer 23 is formed between the magnetization fixed layer 2 (antiferromagnetic layer 11) and the underlayer film 10 under the magnetization fixed layer 2 as the ferromagnetic layer having the magnetization component in the laminating direction. The magnetization region having the upward magnetization M23a and the magnetization region having the downward magnetization M23b, that is, a plurality of magnetization regions in which magnetization directions are opposite to each other, are formed in this vertical magnetization layer 23.

These magnetization regions enable the large spin torques Ta and Tb inn opposite directions to each other to act on the magnetization M1 of the storage layer 3 as in the storage elements 1 and 20 of the preceding embodiments.

Consequently, since the direction of the magnetization M1 of the storage layer 3 can be easily inverted, it is possible to invert the direction of the magnetization M1 of the storage layer 3 by the spin injection current Iz of a relatively small amount of an electric current.

Accordingly, the spin injection current Iz required in recording information can be decreased, and thereby power consumption can be decreased.

Also, according to the storage element 30 of an embodiment, since the large spin torques Ta and Tb in opposite directions to each other can be caused to act on the magnetization M1 of the storage layer 3, it becomes possible to carry out stable switching regardless of the pulse width of the spin injection current Iz.

As a result, information can be recorded stably, and it is possible to realize the storage element 30 that is highly reliable.

Also, since the margin of the spin injection current Iz relative to the pulse width is widened, the storage element 30 can be stably operated even though characteristics of memory cells are slightly fluctuated among the memory cells, and it becomes possible to operate even a large capacity memory having a large number of memory cells stably.

Accordingly, by adopting the structure that having a large number of memory cells formed of the storage element 30 shown in FIG. 6, it is possible to realize a large capacity memory that consumes less power and that can be operated stably.

It should be noted that while the direction of the magnetization of the ferromagnetic layer of the magnetization fixed layer 2 is fixed by the antiferromagnetic layer 1 in the above-mentioned respective embodiments, the present application can also be applied to a structure in which the direction of magnetization of a magnetization fixed layer is fixed without providing an antiferromagnetic layer and a structure in which the direction of magnetization of a magnetization fixed layer is fixed by laminating a hard magnetic layer and a ferromagnetic layer.

Of the above-mentioned respective modified structures, a case that the structure of the embodiment shown in FIG. 6 is modified and the direction of magnetization of a magnetization fixed layer is fixed without providing an antiferromagnetic layer will be described next.

Figure 7:
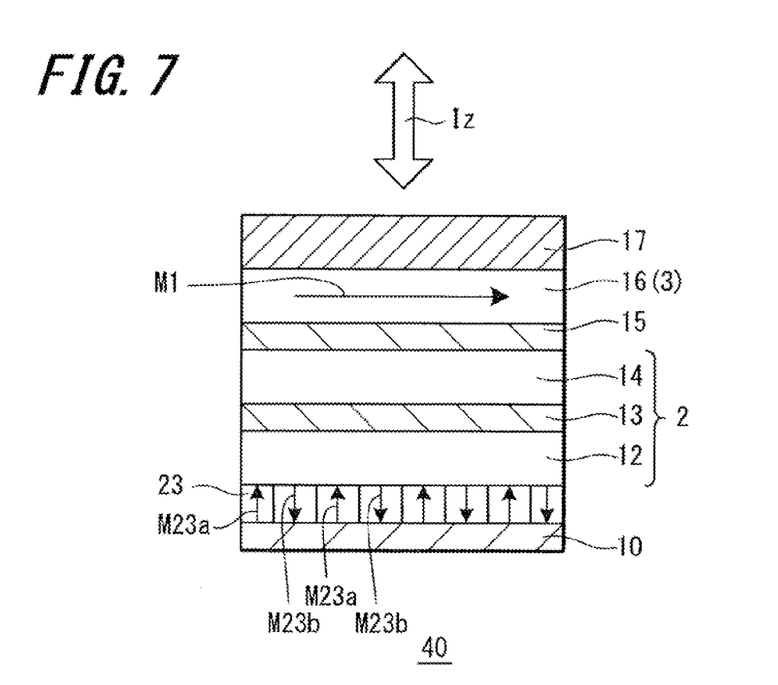
FIG. 7 is a constructional diagram (cross-sectional view) showing a storage element according to yet another embodiment.

FIG. 7 is a schematic structural diagram (schematic cross-sectional view) showing a storage element according to yet another embodiment.

A storage element 40 shown in FIG. 7 has a structure that the antiferromagnetic layer 11 is removed from the storage element 30 shown in FIG. 6, the vertical magnetization layer 23 being provided between the ferromagnetic layer 12 under the magnetization fixed layer 2 and the underlayer film 10.

This storage element 40 can achieve effects similar to those achieved by the storage element 30 shown in FIG. 6.

It should be noted that the particle-state ferromagnetic material 21 similar to that of the storage element 1 shown in FIG. 3 can be provided in the storage elements 30 and 40 shown in FIGS. 6 and 7 instead of the vertical magnetization layer 23. The embodiments include such structure.

While the upward magnetizations M21a, M22a, M23a and the downward magnetizations M21b, M22b, M23b, that is, the magnetization regions having the magnetizations in the laminating directions of respective layers (directions perpendicular to the film plane direction) of the storage element 1, are respectively formed in the above-mentioned respective embodiments, the present application is not limited thereto and magnetization regions having oblique magnetizations relative to the film plane direction can be formed. In this case, directions of magnetizations may be set in oblique upward directions and in oblique downward directions so that magnetization components in the laminating direction may be an upward magnetization component and a downward magnetization component in opposite directions.

According to the above-mentioned respective embodiments, since the magnetization fixed layer 2 is formed under the storage layer 3, the magnetization region having the magnetization component in the laminating direction within the ferromagnetic layer 13 is arranged on the lower layer side of the storage layer 3.

On the other hand, it may be configured such that the magnetization fixed layer is formed in the upper layer of the storage layer and the magnetization region is arranged on the upper layer side of the storage layer (the side opposite to the storage layer of the magnetization fixed layer).

Also, it may be configured such that magnetization fixed layers are formed above and under the storage layer and the magnetization region is arranged on the opposite side of the storage layer in both of or either of the magnetization fixed layers.

While the magnetization fixed layer 2 is constituted by the ferromagnetic layers 12 and 14 in two layers through the nonmagnetic layer 13 in the above-mentioned respective embodiments, according to the present application, the magnetization fixed layer may be constituted by a single or more than three ferromagnetic layers. Then, a magnetization region having a magnetization component in a laminating direction may be formed in the single ferromagnetic layer or in one or more layers of the more than three ferromagnetic layers.

While the storage layer 3 is constituted by the single ferromagnetic layer 16 in the above-mentioned respective embodiments, according to the present application, the storage layer may be constituted by a plurality of ferromagnetic layers which are ferromagnetically-coupled or antiferromagnetically-coupled. There can be considered a structure in which a plurality of ferromagnetic layers are laminated through nonmagnetic layers or a structure in which a plurality of ferromagnetic layers are laminated directly (in the case of this structure, adjacent ferromagnetic layers are different in material or composition).

It should be noted that according to an embodiment, a storage element can be formed so as to have a GMR element structure by providing a nonmagnetic intermediate layer instead of the tunnel insulating layer 15 of the above-mentioned respective embodiments.

If the storage element has the TMR element structure as in the above-mentioned respective embodiments, then it is possible to maintain a large MR ratio.

The present application is not limited to the above-mentioned respective embodiments and may have various other structures without departing from the gist of the present application.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
    a storage layer for holding information depending on a magnetization state of a first magnetic material;
    a magnetization fixed layer in which a magnetization direction is fixed, that is arranged relative to the storage layer through a nonmagnetic layer; and
    a second magnetic material having a plurality of magnetization regions including first magnetization regions oriented in a first laminating direction and second magnetization regions oriented in a second laminating direction substantially opposite to the first laminating direction,
    wherein the magnetization fixed layer includes a layer with a magnetization in a film plane direction, and
    wherein the magnetization direction of the storage layer is changed with application of an electric current in a laminating direction to enable information to be recorded to the storage layer.

2. A storage element according to claim 1, wherein the second magnetic material is dispersed in the magnetization fixed layer in a state of particles.

3. A storage element according to claim 1, wherein the second magnetic material is formed in the magnetization fixed layer in a layer state, and the magnetization regions are divided by magnetic domains.

4. A storage element according to claim 1, wherein the second magnetic material is dispersed in a state of particles on the opposite side of the magnetization fixed layer relative to the storage layer.

5. A storage element according to claim 1, wherein the second magnetic material is formed in a layer state on the opposite side of the magnetization fixed layer relative to the storage layer, and the magnetization regions are divided by magnetic domains.

6. A memory comprising:
    a storage element including a storage layer for holding information depending on a magnetization state of a first magnetic material, a magnetization fixed layer in which a magnetization direction is fixed and which is arranged relative to the storage layer through a nonmagnetic layer, the magnetization direction of the storage layer being changed with application of an electric current in a laminating direction to enable information to be recorded to the storage layer, and a second magnetic material having a plurality of magnetization regions including first magnetization regions oriented in a first laminating direction and second magnetization regions oriented in a second laminating direction substantially opposite to the first laminating direction; and
    a wiring for supplying an electric current that is caused to flow in the laminating direction of the storage element,
    wherein the magnetization fixed layer includes a layer with a magnetization in a film plane direction.

* * * * *